(12) United States Patent
Kim et al.

(10) Patent No.: US 11,508,598 B2
(45) Date of Patent: Nov. 22, 2022

(54) FRAME JIG FOR MANUFACTURING SEMICONDUCTOR PACKAGE, APPARATUS INCLUDING SAME, AND METHOD USING SAME

(71) Applicant: SAMSUNG ELECTRONICS CO., LTD., Suwon-si (KR)

(72) Inventors: Seungwan Kim, Anyang-si (KR); Hyunsuk Yang, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 95 days.

(21) Appl. No.: 17/007,883

(22) Filed: Aug. 31, 2020

(65) Prior Publication Data

US 2021/0233792 A1 Jul. 29, 2021

(30) Foreign Application Priority Data

Jan. 29, 2020 (KR) .................. 10-2020-0010485

(51) Int. Cl.
*H01L 21/683* (2006.01)
*H01L 21/78* (2006.01)
*H01L 21/56* (2006.01)
*H01L 21/67* (2006.01)
*H01L 21/60* (2006.01)

(52) U.S. Cl.
CPC ............ *H01L 21/683* (2013.01); *H01L 21/56* (2013.01); *H01L 21/67092* (2013.01); *H01L 21/78* (2013.01); *H01L 2021/60135* (2013.01)

(58) Field of Classification Search
CPC . H01L 21/683; H01L 21/56; H01L 21/67092; H01L 21/78; H01L 2021/60135; H01L 23/3128; H01L 21/561; H01L 2221/68359; H01L 21/6835; H01L 21/568; H01L 21/67121; H01L 21/68; H01L 23/02; H01L 23/06; H01L 23/13; H01L 23/31; H01L 23/525; H01L 24/89
USPC ........................................................ 438/113
See application file for complete search history.

(56) References Cited

U.S. PATENT DOCUMENTS

| | | | | |
|---|---|---|---|---|
| 6,979,593 B2 * | 12/2005 | Kawakami | .............. | H01L 21/56 438/464 |
| 7,170,153 B2 * | 1/2007 | Saga | ..................... | H01L 21/561 257/E23.067 |
| 7,571,538 B2 | 8/2009 | Teshirogi et al. | | |
| 7,935,574 B2 * | 5/2011 | Saiki | ....................... | H01L 24/29 438/113 |
| 8,237,292 B2 * | 8/2012 | Shibuya | .............. | H01L 23/3121 257/788 |
| 8,394,677 B2 * | 3/2013 | Sakurada | .............. | H01L 21/304 438/113 |
| 8,703,583 B2 | 4/2014 | Maki et al. | | |

(Continued)

FOREIGN PATENT DOCUMENTS

| | | | |
|---|---|---|---|
| JP | 4942329 B2 | 5/2012 | |
| JP | 5813289 B2 | 11/2015 | |

(Continued)

*Primary Examiner* — Vu A Vu
(74) *Attorney, Agent, or Firm* — Volentine, Whitt & Francos, PLLC

(57) ABSTRACT

A frame jig for manufacturing a semiconductor package includes a frame body of a rectangular shape attached to a package structure of a panel shape, wherein the frame body comprises polyphenylene sulfide.

17 Claims, 12 Drawing Sheets

(56) References Cited

U.S. PATENT DOCUMENTS

| | | | |
|---|---|---|---|
| 9,136,144 B2* | 9/2015 | Lim | H01L 24/94 |
| 9,287,204 B2* | 3/2016 | Kim | H01L 21/563 |
| 9,711,461 B2* | 7/2017 | Kitajo | H01L 23/49827 |
| 2013/0003416 A1* | 1/2013 | Saga | C09K 19/3809 |
| | | | 362/633 |

FOREIGN PATENT DOCUMENTS

| | | |
|---|---|---|
| JP | 5995636 B2 | 9/2016 |
| JP | 2019140274 A | 8/2019 |
| KR | 1020120037764 | 4/2012 |
| KR | 102026705 | 9/2019 |

* cited by examiner

II - II'

FRAME JIG FOR MANUFACTURING SEMICONDUCTOR PACKAGE, APPARATUS INCLUDING SAME, AND METHOD USING SAME

CROSS-REFERENCE TO RELATED APPLICATION

This application claims the benefit of Korean Patent Application No. 10-2020-0010485, filed on Jan. 29, 2020 in the Korean Intellectual Property Office, the subject matter of which is hereby incorporated by reference.

BACKGROUND

The inventive concept relates to a frame jig for manufacturing a semiconductor package, an apparatus including the frame jig for manufacturing a semiconductor package, and a method of manufacturing the semiconductor package using the frame jig.

Panel level package processing and/or wafer level package processing are often performed on a structure including semiconductor chips, a molding material, a redistribution layer and external connection terminals. However, when a semiconductor package manufacturing process is performed in relation to this type of structure, warpage may occur in the structure due to (e.g.,) differences in coefficients of thermal expansion between individual materials, components and/or material layers that form the structure.

SUMMARY

Embodiments of the inventive concept provide a frame jig for manufacturing a semiconductor package used in a semiconductor package manufacturing process using a panel-shaped package structure. Embodiments of the inventive concept provide a semiconductor package manufacturing apparatus including a frame jig for manufacturing a semiconductor package. Embodiments of the inventive concept provide a method of manufacturing a semiconductor package using a frame jig for manufacturing the semiconductor package.

According to an aspect of the inventive concept, there is provided a frame jig for manufacturing a semiconductor package and including; a frame body having a rectangular shape attached to a panel-shaped package structure, wherein the frame body comprises polyphenylene sulfide.

According to an aspect of the inventive concept, there is provided a semiconductor package manufacturing apparatus including; a stage that supports a panel-shaped package structure including a main surface and a plurality of semiconductor chips mounted on the main surface, and a frame jig including a ring-shaped frame body attached to outer edges of the package structure, wherein the ring-shaped frame body at least partially surrounds the main surface of package structure.

According to an aspect of the inventive concept, there is provided a method of manufacturing a semiconductor package. The method includes; forming a panel-shaped package structure including a main surface and a plurality of semiconductor chips arranged on the main surface, attaching a frame jig to an edge portion of the main surface of the package structure, performing a reflow process to form an external connector on the package structure, and cutting the package structure along a scribe lane of the package structure.

According to an aspect of the inventive concept, there is provided a method of manufacturing a semiconductor package. The method includes; arranging a plurality of semiconductor chips on a first carrier substrate, wherein each one of the plurality of semiconductor chips includes a bottom surface, and forming an encapsulant on the first carrier substrate to seal the plurality of semiconductor chips to provide a resultant structure having an upper surface, removing the first carrier substrate from the resultant structure, turning over the resultant structure and attaching the upper surface of the resultant structure to a second carrier substrate to expose bottom surfaces of the plurality of semiconductor chips, forming a redistribution structure on an upper surface of the encapsulant and the bottom surfaces of the plurality of semiconductor chips, removing the second carrier substrate and attaching a frame jig to a lower surface of the encapsulant to form a panel-shaped package structure, wherein the frame jig includes a frame body having a rectangular shape attached to the panel-shaped package structure, wherein the frame body comprises polyphenylene sulfide.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, certain embodiments of the inventive concept will be described in some additional detail with reference to the accompanying drawings. Throughout the written description and drawings like reference numbers and labels are used to denote like or similar elements and/or features. Throughout the written description certain geometric terms may be used to highlight relative relationships between elements, components and/or features with respect to embodiments of the inventive concept. Those skilled in the art will recognize that such geometric terms are relative in nature, arbitrary in descriptive relationship and/or directed to aspect(s) of the embodiments illustrated in the accompanying drawings. Such geometric terms may include, for example: height/width; vertical/horizontal; top/bottom;

higher/lower; closer/farther; thicker/thinner; proximate/distant; above/below; under/over; upper/lower; center/side; surrounding; overlay/underlay; etc.

Figure 1:
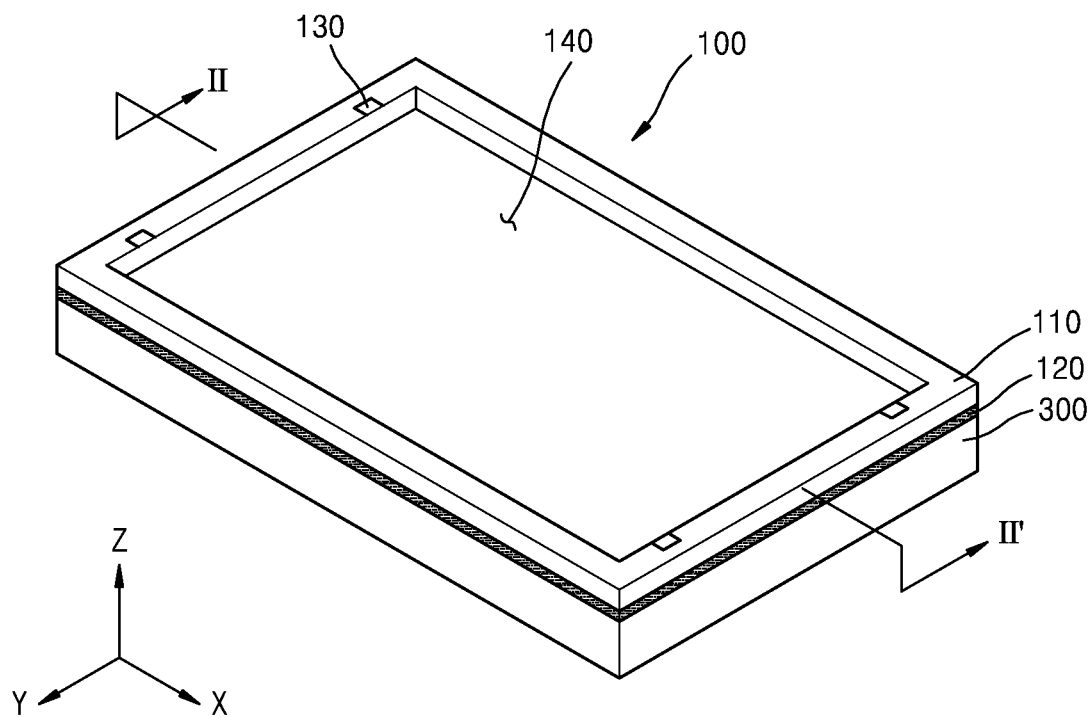
FIG. 1 is a perspective view illustrating a frame jig for manufacturing a semiconductor package attached to a package structure according to embodiments of the inventive concept.
Figure 2:
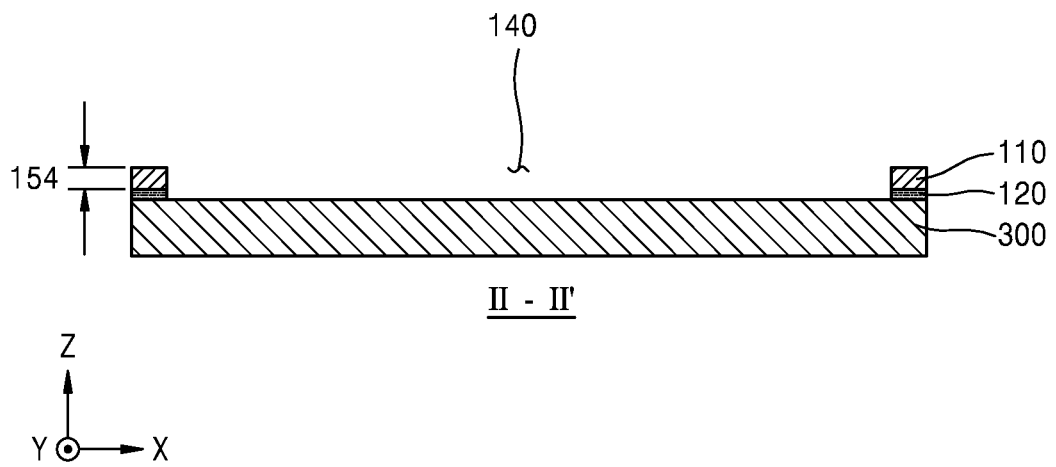
FIG. 2 is a cross-sectional view taken along the line II-If of the frame jig and package structure of FIG. 1.

FIG. 1 is a perspective view illustrating a frame jig 100 for manufacturing a semiconductor package attached to a panel-shaped package structure 300 according to embodiments of the inventive concept. FIG. 2 is a cross-sectional view of the frame jig 100 and the panel-shaped package structure 300 taken along line II-II' of FIG. 1, and FIG. 3 is a plan view of the frame jig 100 according to embodiments of the inventive concept.

Figure 3:
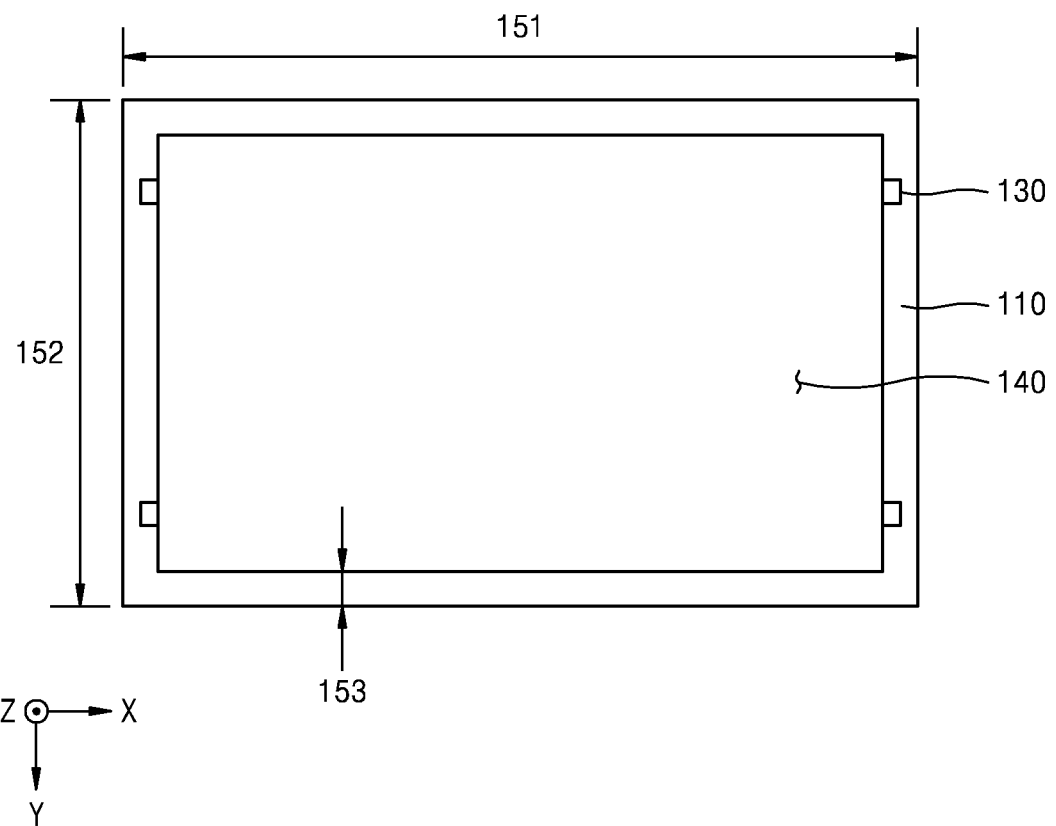
FIG. 3 is a plan (or top) view of the frame jig of FIGS. 1 and 2.

Referring to FIGS. 1, 2 and 3, the frame jig 100 may be used during the manufacture a semiconductor package. In the embodiments illustrated in the accompanying drawings, the frame jig 100 is assumed to be used during a panel level package process. However, the inventive concept is not limited thereto, and the frame jig 100 may alternately or additionally be used during a wafer level package process.

The frame jig 100 may be attached to the panel-shaped package structure 300 in order to support the package structure 300 during one or more semiconductor package manufacturing process(es). For example, the frame jig 100 may be configured to support the package structure 300 while a semiconductor package manufacturing process is performed in a process chamber, or while the package structure 300 is being transferred between the process chambers. When the frame jig 100 is attached to the package structure 300 to support the package structure 300, the possibility of mechanical damage or deformation (e.g., warpage) to the package structure 300 maybe reduced or eliminated.

Those skilled in the art will recognize that the package structure 300 may include an intermediate structure resulting from partial completion of the overall manufacturing process for the semiconductor package. For example, the package structure 300 may be an intermediate structure resulting from one or more panel-level package manufacturing process(es).

In certain embodiments, the package structure 300 may include a plurality of semiconductor chips (see, e.g., FIG. 10) arranged in a matrix of rows and columns, an encapsulant covering the plurality of semiconductor chips, and a redistribution structure formed on the plurality of semiconductor chips.

In certain embodiments, the package structure 300 may include a support substrate (see, e.g., FIG. 18) used for panel level packaging, the plurality of semiconductor chips accommodated in cavities of the support substrate, as well as the encapsulant covering the plurality of semiconductor chips, and the redistribution structure.

In the illustrated embodiments, the package structure 300 is assumed to have a panel shape (or a flat plate shape). However, the package structure 300 is not limited to only the panel shape, but may instead have a rectangle panel shape, a quadrangle shape, a polygonal shape, a triangle shape, a pentagon shape, a circular shape, etc.

The frame jig 100 illustrated in FIGS. 1, 2 and 3 includes a frame body 110 formed as a closed loop (or ring shape) that continuously extends around the edges of a main surface of the package structure 300 to which the frame jig 100 is attached. Thus, the ring shaped frame body 110 may define an opening 140 exposing a center region at least partially surrounded by an edge region of the main surface of the package structure 300 to which the frame body 110 is attached. Here, the frame body 110 may be attached to the edge region of the main surface of the package structure 300. That is, the frame body 110 may be attached to an outer region of the main surface of the package structure 300 (e.g., in a scribe lane (see, e.g., FIG. 10) of the package structure 300).

In certain embodiments, the frame body 110 may have a quadrangle frame or a quadrangular ring shape. Thus, when the frame body 110 is a quadrangle frame, it may include four bars respectively constituting sides of the frame body 110, wherein two neighboring bars among the four bars are arranged perpendicular to each other, such that the frame body 110 has a rectangular shape. In this regard, the four bars forming the frame body 110 may have substantially the same width (e.g., as measured in at least one of the horizontal (or X and Y) directions), and/or substantially the same height (e.g., as measured in the vertical (or Z) direction).

However, the shape of the frame body 110 is not limited to the quadrangular shape or a rectangular ring shape, and the shape of the frame body 110 may vary according to the shape of the package structure 300 to which the frame body 110 is attached. For example, when the package structure 300 of a panel shape includes the main surface of the polygonal shape, the frame jig 100 may have a polygonal frame or a polygonal ring shape corresponding thereto. Alternatively, when the package structure 300 of a panel shape has the main surface of a circular shape, the frame jig 100 may have a circular frame or a circular ring shape corresponding thereto.

Referring to FIG. 2, a cross-sectional shape of the frame body 110 in the Z direction (e.g., perpendicular to the main surface of the package structure 300) may be rectangular. In this case, the frame body 110 may have a first surface in contact with the main surface of the package structure 300 and an opposing second surface.

The frame body 110 may have a size that is substantially the same (or similar to) as the package structure 300. For example, a horizontal length 151 (e.g., measured in the X direction) of the outer circumference of the frame body 110 may be substantially the same as a horizontal width of the package structure 300, and a horizontal width 152 (e.g., measured in the Y direction) of the outer circumference of the frame body 110 may be substantially the same as a vertical width of the package structure 300. With this exemplary configuration, when the frame body 110 is attached to the package structure 300, an outer edge surface of the frame body 110 may be coplanar with an outer side surface of the package structure 300.

In other embodiments, the horizontal length 151 and the horizontal width 152 of the outer circumference of the frame body 110 may be different from the horizontal length and the horizontal width of the package structure 300, respectively. For example, the horizontal length 151 and the horizontal width 152 of a body of the frame jig 100 may be less than the horizontal length and horizontal width of the package structure 300, respectively. In this case, when the frame body 110 is attached to the package structure 300, the outer edge surface of the frame body 110 may be disposed inside the outer side surface of the package structure 300. Alternately, the horizontal length 151 and the horizontal width 152 of the outer circumference of the frame jig 100 may be greater than the horizontal length and the horizontal width of the package structure 300, respectively. In this case, when the frame jig 100 is attached to the package structure 300, the outer edge surface of the frame jig 100 may be disposed outside the outer side surface of the package structure 300.

In certain embodiments like the one illustrated in FIGS. 1 and 2, the frame jig 100 may include an adhesive material layer 120 on a lower surface of the frame jig 100 that contacts a portion of an upper surface of the package structure 300. In this regard, the adhesive material layer 120 may be used to attach the frame body 110 to the package structure 300, as the adhesive material layer 120 may entirely (or partially) cover the lower surface of the frame jig 100.

In certain embodiments, the adhesive material layer 120 may include a double-sided tape including (e.g.,) a polyimide. In certain embodiments, the adhesive material layer 120 may provide an adhesive force of at least about 900 gf/inch, such that the frame body 110 is safely adhered (or fixed) to the package structure 300.

The frame jig 100 may include one or more identification mark(s) 130 visible (or externally discernable) on the frame body 110. The identification mark 130 may be placed (e.g.,) on an upper surface of the frame body 110. In certain embodiments, the identification mark 130 may include a particular pattern that is recognizable to an external device, like an optical scanner. The identification mark 130 may be used to detect positioning and/or alignment of the frame jig 100, and/or the positioning and and/or alignment of the package structure 300 to which the frame jig 100 is attached.

Where multiple identification marks 130 are used in conjunction with the frame jig 100, the number of identification marks 130 included on the frame jig 100 may correspond to the number of frame body 110 sides. For example, four (4) identification marks 130 may be placed on the frame body 110 to readily detect positioning and/or alignment of a rectangular-shaped frame body 110.

In certain embodiments, the frame body 110 may be manufactured using an injection molding process that is advantageous for mass production. In this case, the frame body 110 may include a plastic material suitable for the injection molding process. However, the material(s) forming the frame body 110 is not limited thereto, and depending on particular application the frame body 110 may be formed from plastic(s), ceramic(s) and/or metal(s), etc. Here, however, the frame body 110 should include material(s) exhibiting excellent mechanical strength (or rigidity), heat resistance, and/or chemical resistance properties. Of particular importance, the frame body 110 should include material(s) exhibiting excellent mechanical properties that will suppress warpage of the package structure 300 during various manufacturing process(es).

In certain embodiments, a flexural modulus of the frame body 110 may be at least about 15 GPa. When the flexural modulus of the frame body 110 is less than about 15 GPa, it may be difficult to suppress warpage of the package structure 300 using the frame jig 100. Additionally in certain embodiments, the flexural modulus of the frame body 110 may less than about 25 GPa. With regard to this additional property, the frame jig 100 may be removed using a sawing process applied to the package structure 300, and when the flexural modulus of the frame body 110 is greater than about 25 GPa, a sawing blade (see, e.g., FIG. 15) used during the sawing process may be damaged during the cutting of the frame jig 100. Here, the flexural modulus of the frame body 110 may be determined at room temperature or at a reference temperature ranging between about 15° C. and about 25° C. (e.g., 23° C.).

In certain embodiments, the tensile strength of the frame body 110 may be at least about 200 MPa. When the tensile strength of the frame body 110 is less than about 200 MPa, it may be difficult to suppress warpage of the package structure 300 using the frame jig 100. Additionally, the tensile strength of the frame body 110 may be less than about 300 MPa, otherwise a sawing blade used to saw the package structure 300 may be damaged during cutting the frame jig 100. Here again, the tensile strength of the frame body 110 may be determined at room temperature or a reference temperature ranging between about 15° C. and about 25° C. (e.g., 23° C.).

In certain embodiments, the frame body 110 may include polyphenylene sulfide (PPS). In this regard, PPS is a high molecular polymer having a chemical structure in which sulfur is bonded to a benzene ring. Thus, PPS provides excellent rigidity, heat resistance, and chemical resistance, and PPS may be injection molded to form the frame body 110.

In certain embodiments, the frame body 110 may include a composite material in which glass fiber, carbon fiber, or various inorganic materials are added to PPS. In this case, the frame body 110 may be manufactured by appropriately adjusting type(s) and/or amount(s) of materials added to PPS, such that the frame body 110 exhibits appropriate rigidity, heat resistance and chemical resistance.

For example, the frame body 110 may include a composite material in which about 30% to about 40% of glass fiber is added to PPS. Alternately, the frame body 110 may include a composite material in which about 30% to about 40% of carbon fiber is added to PPS. Alternately or additionally, the frame body 110 may include polyetherimide, as polyetherimide is a material exhibiting excellent rigidity, heat resistance, and chemical resistance. Further, the frame body 110 may be manufactured using an injection molding process including polyetherimide as an injection material.

In certain embodiments, the frame body 110 may include a material in which glass fiber and/or carbon fiber are added to the polyetherimide. In example embodiments, the frame body 110 may include a composite material in which about 30% to about 40% of carbon fiber is added to polyetherimide. For example, the frame body 110 may include a composite material in which about 40% of carbon fiber is mixed with polyetherimide.

In certain embodiments, the frame body 110 may have a horizontal width 153 (e.g., measured in the Y direction) ranging between about 2 mm and about 30 mm (including boundary values). When the horizontal width 153 of the frame body 110 is less than about 2 mm, an area where the frame body 110 is joined to the package structure 300 may too small to preclude unintentional separation between the frame body 110 and the package structure 300. In addition, when the horizontal width 153 of the frame body 110 is greater than about 30 mm, the scribe lane SLA of the package structure 300 to which the frame body 110 is attached may be increased in size, thereby reducing overall productivity of the semiconductor package manufacturing process.

In certain embodiments, the lower surface of the frame body 110 contacts the upper surface of the package structure 300 through the adhesive material layer 120, and the frame body 110 has a vertical height (e.g., measured in the Z direction) 154 ranging between about 1.4 mm and about 60 mm (including boundary values). Here, if the height 154 of the frame body 110 is less than about 1.4 mm, the warpage of the package structure 300 may be insufficiently suppressed. Additionally, if the height 154 of the frame body 110 is greater than about 60 mm, during a sawing process that cuts the frame jig 100, a sawing blade may become damaged or cutting residue generated by the sawing blade may be deposited into the package structure 300.

In general, during the manufacturing of the semiconductor package, due to difference in the coefficients of thermal expansion between individual components constituting the package structure 300, warpage is likely to occur in the package structure 300. However, when warpage above a certain level occurs, the reliability of subsequent semiconductor process(es) may deteriorate, and/or the package structure 300 may not be properly loaded on a magazine configured to mount the package structure 300 during transportation of the package structure 300. In particular, during the manufacturing of a panel-level package, a plurality of semiconductor chips may be arranged in a matrix and sealed by an encapsulant to form the panel-shaped package structure 300. Because the package structure 300 has a large area, panel shape, considerable warpage (e.g., warpage of about 10 mm or more) may occur in the package structure 300.

However, according to embodiments of the inventive concept, warpage of the package structure 300 may be notably suppressed using the frame jig 100. For example, when the frame jig 100 described in relation to FIGS. 1, 2 and 3 is attached to the package structure 300, the warpage of the package structure 300 may be suppressed much lower levels (e.g., about 2 mm or less). And because warpage of the package structure 300 is suppressed to a low level, the reliability of the semiconductor package manufactured from the package structure 300 may be improved.

Figure 4:
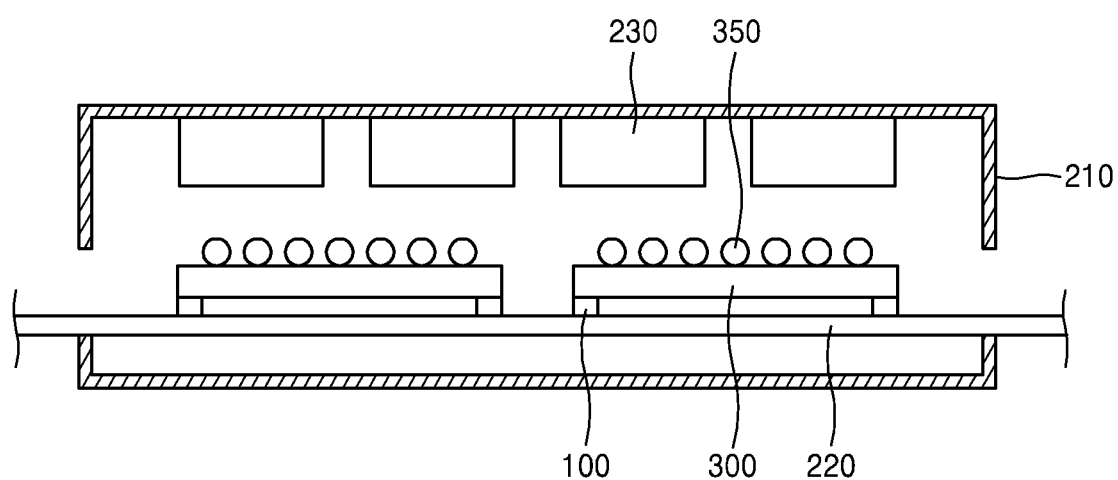
FIG. 4 is a conceptual diagram illustrating a semiconductor package manufacturing apparatus according to embodiments of the inventive concept.

FIG. 4 is a conceptual diagram illustrating a semiconductor package manufacturing apparatus 200 according to embodiments of the inventive concept.

Referring to FIG. 4, the semiconductor package manufacturing apparatus 200 may include a process chamber 210 and a stage 220.

The process chamber 210 may form an internal space for performing a semiconductor package manufacturing process on the package structure 300. The process chamber 210 may include at least one opening through which the package structure 300 is carried-in and/or carried-out. To protect the internal space of the process chamber 210 from an external environment, the opening of the process chamber 210 may be closed or sealed as necessary.

The stage 220 may be used to support the package structure 300 within the process chamber 220. In certain embodiments, the stage 220 may include a conveyor belt configured to transport the package structure 300 in one direction through the process chamber 210. Although not illustrated in FIG. 4, the package structure 300 may be transported along the stage 220 by being mounted on a carrier to which the package structure 300 is vacuum fixed.

In certain embodiments, the semiconductor package manufacturing apparatus 200 may include a reflow device used to perform a reflow process of an external connector 350 mounted on the package structure 300. In this case, the semiconductor package manufacturing apparatus 200 may include a heating unit 230 within the process chamber 210. The heating unit 230 may include a heat source for heating the external connector 350 to a desired temperature. For example, the heating unit 230 may include a heater which generates hot air, an infrared heater, or a laser heater. In addition, the process chamber 210 may further include a cooling unit for cooling the external connector 350 after it has been heated by the heating unit 230. The cooling unit may, for example, rapidly cure the melted external connector 350 by supplying air at room temperature or lower.

During the reflow process, because the frame jig 100 supporting the package structure 300 is exposed to a high temperature environment, the frame jig 100 may include material(s) exhibiting excellent heat resistance. For example, the frame body 110 may have heat resistance such that the frame body 110 does not deform for at least about 4 minutes at a temperature of at least about 240° C.

According to embodiments of the inventive concept, while the semiconductor package manufacturing process (e.g., a reflow process) in which a high temperature is applied to the package structure 300 is performed, because the frame jig 100 suppresses warpage of the package structure 300, damage to the package structure 300 due to warpage may be prevented and the overall reliability of the semiconductor package manufactured from the package structure 300 may be improved.

Figure 5:
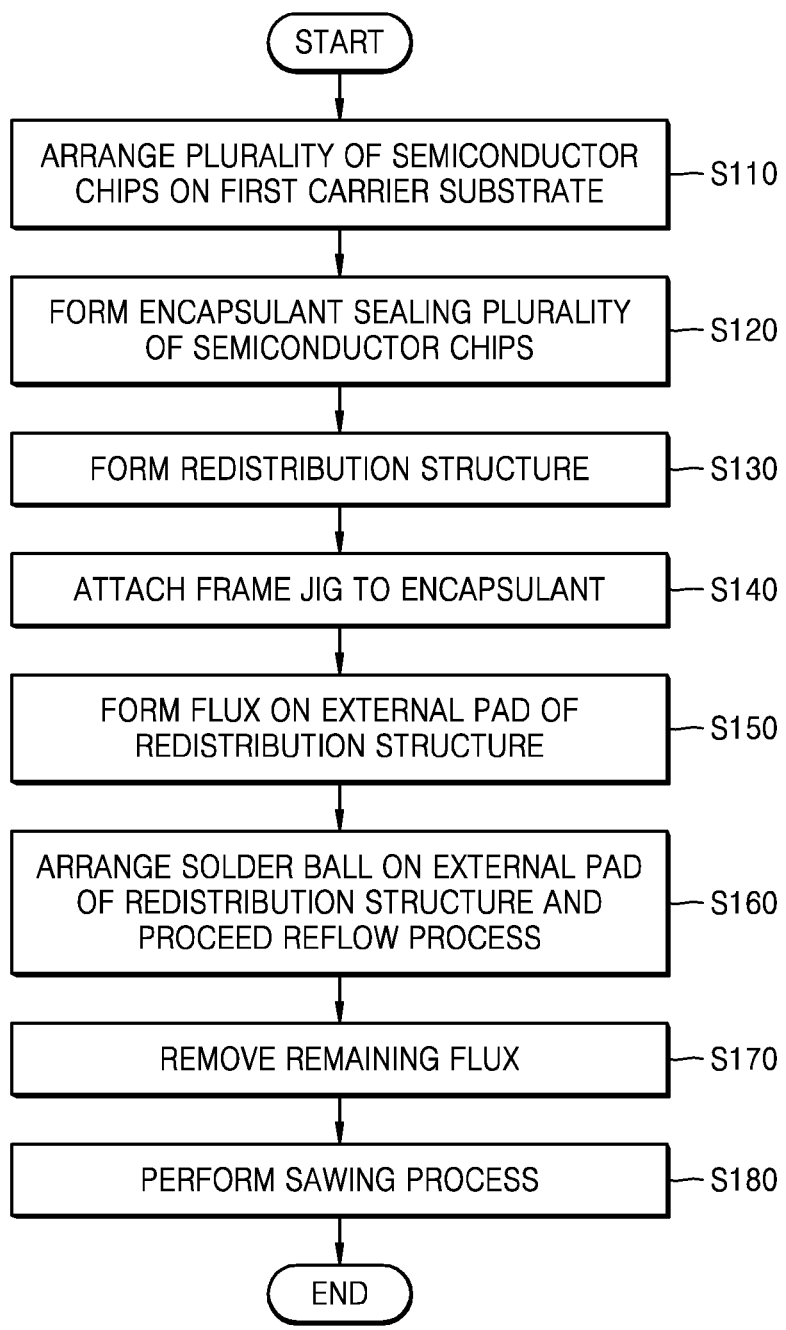
FIG. 5 is a flowchart summarizing in one example a method of manufacturing a semiconductor package according to embodiments of the inventive concept.
Figure 8:
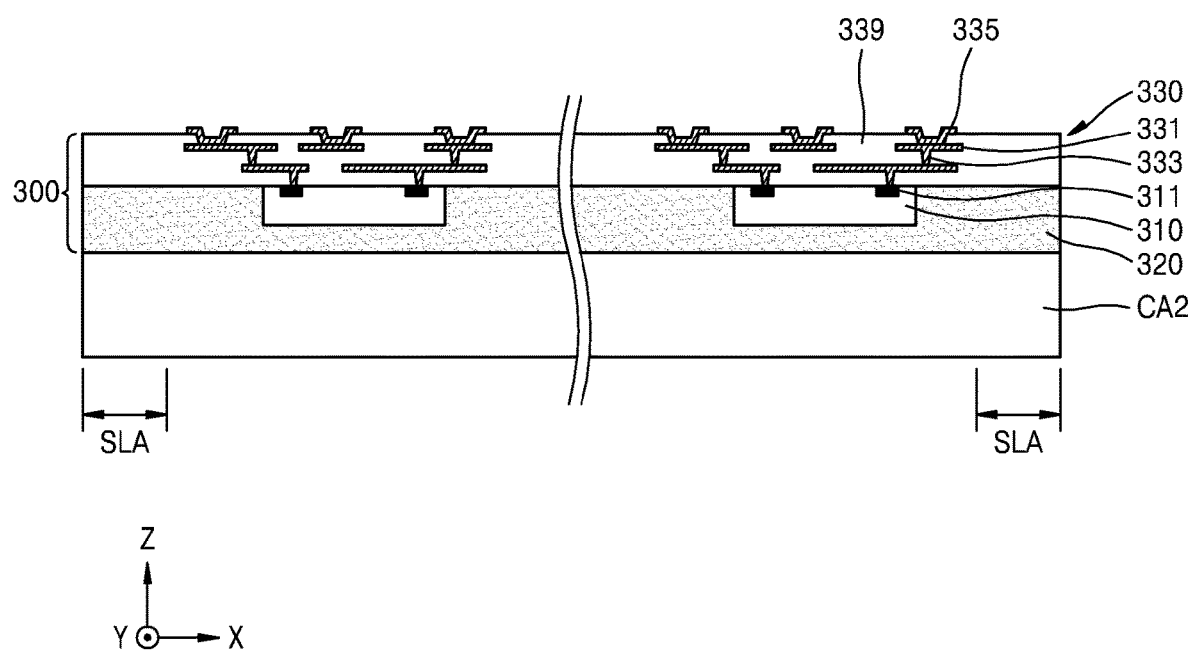
Figure 9:
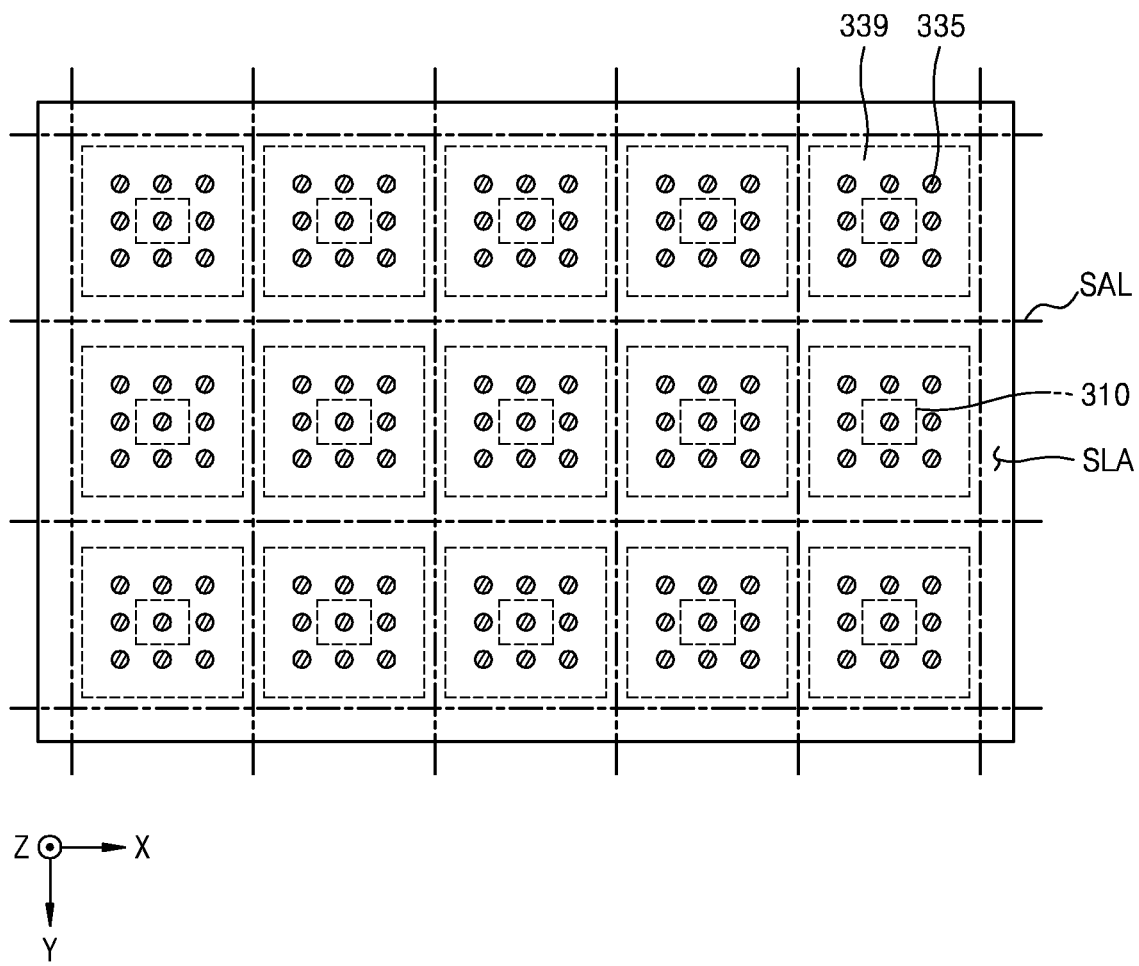

FIG. 5 is a flowchart summarizing in one example a method of manufacturing a semiconductor package according to embodiments of the inventive concept. FIGS. 6 through 15 are related cross-sectional and plan view diagrams illustrating in one example a method of manufacturing a semiconductor package according to embodiments of the inventive concept. Here, FIG. 9 is a top (or upper) plan view of the package structure 300 of FIG. 8 and FIG. 11 is a bottom (or lower) plan view of the package structure 300 of FIG. 10.

Figure 6:
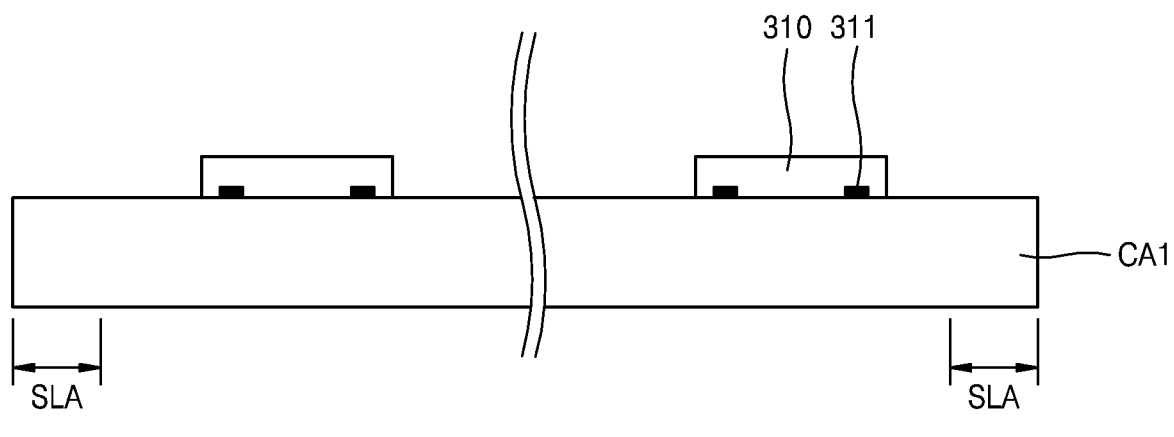
FIGS. 6, 7, 8, 9, 10, 11, 12, 13, 14 and 15 (collectively, "FIGS. 6 through 15") are related cross-sectional diagrams illustrating in one example a method of manufacturing a semiconductor package according to embodiments of the inventive concept.

Referring to FIGS. 5 and 6, a plurality of semiconductor chips 310 are arranged on a first carrier substrate CA1 (S110). The plurality of semiconductor chips 310 may be spaced apart from each other on the first carrier substrate CA1 at constant intervals. For example, the plurality of semiconductor chips 310 may be arranged in a matrix of rows and columns on the first carrier substrate CA1.

Here, each one of the plurality of semiconductor chips 310 may include a memory chip and/or a logic chip, where the memory chip may include at least one of a volatile memory semiconductor chip such as dynamic random access memory (RAM) (DRAM) and static RAM (SRAM), or a nonvolatile memory chip such as phase-change RAM (PRAM), magneto-resistive RAM (MRAM), ferroelectric RAM (FeRAM), and resistive RAM (RRAM). In some embodiments, the memory chip may include a high bandwidth memory (HBM) memory semiconductor chip. In addition, the logic chip may include, for example, a microprocessor, an analog element, or a digital signal processor.

Each one of the plurality of semiconductor chips 310 may include a semiconductor substrate and the chip pad 311 on a lower surface of the semiconductor substrate. The semiconductor substrate may include, for example, silicon (Si). Alternatively, the semiconductor substrate may include a semiconductor element such as germanium (Ge), or a compound semiconductor such as silicon carbide (SiC), gallium arsenide (GaAs), indium arsenide (InAs), and indium phosphide (InP). The semiconductor substrate may include an active surface and an opposing inactive surface.

Each one of the plurality of semiconductor chips 310 may include a semiconductor device including a many individual devices of various types on the active surface of the semiconductor substrate. The individual devices may include various microelectronic devices, for example, a metal-oxide-semiconductor field effect transistor (MOSFET) such as a complementary metal-insulator-semiconductor (CMOS) transistor, an image sensor such as a system large scale integration (LSI), and CMOS imaging sensor (CIS), a micro-electro-mechanical system (MEMS), an active device, a passive device, etc.

The first carrier substrate CA1 may include material(s) exhibiting good stability during baking process(es), etching process(es), etc. When the first carrier substrate CA1 is to be separated and later removed using (e.g.,) a laser ablation process, the first carrier substrate CA1 may be a transmissive substrate. Selectively, when the first carrier substrate CA1 is to be separated and later removed by applying heat, the first carrier substrate CA1 may include a heat-resistant substrate.

In certain embodiments, the first carrier substrate CA1 may include a glass substrate. Alternately, in other embodiments, the first carrier substrate CA1 may include heat-resistant organic polymer material such as polyimide (PI), polyetheretherketone (PEEK), polyethersulfone (PES), and polyphenylene sulfide, etc.

Although not illustrated in FIG. 6, a release film may be formed on one surface of the first carrier substrate CA1 on which the plurality of semiconductor chips 310 are arranged. The release film may be, for example, a laser reaction layer capable of separating the first carrier substrate CA1 through vaporization in response to irradiation of a laser later. The release film may include a carbon-based material layer. For example, the release film may include an amorphous carbon layer (ACL).

Figure 7:
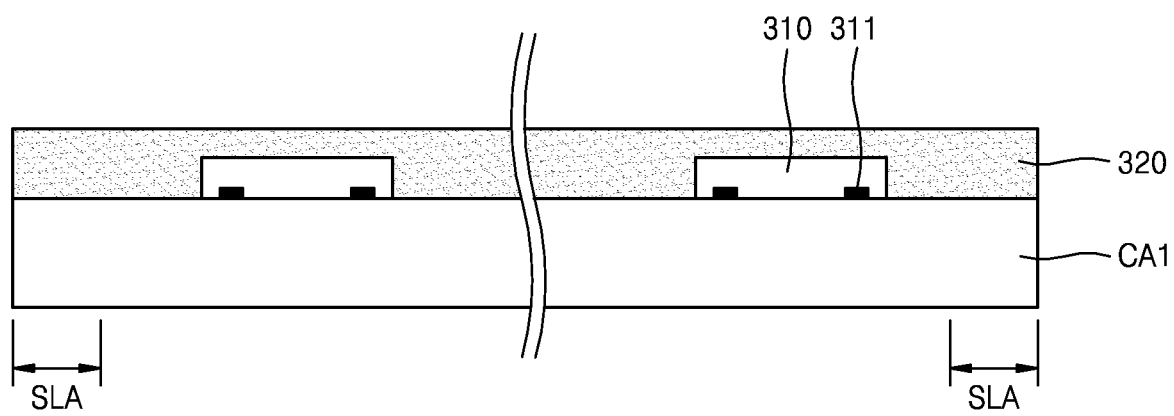

Referring to FIGS. 5 and 7, an encapsulant 320 may be formed on the first carrier substrate CA1 to seal the plurality of semiconductor chips 310 (S120).

Here, the encapsulant 320 may cover side surfaces and top surfaces of the plurality of semiconductor chips 310. In other embodiments, the encapsulant 320 may expose the top surfaces of the plurality of semiconductor chips 310.

To form the encapsulant 320 (e.g.,), a encapsulant material may be injected to cover the plurality of semiconductor chips 310 on the first carrier substrate CAL and may thereafter be cured. Selectively, an upper surface of the encapsulant 320 may be planarized using a chemical mechanical polishing (CMP) process and/or an etch-back process. Selectively, the top surfaces of the plurality of semiconductor chips 310 may be exposed from the encapsulant 320 by a planarization process.

The encapsulant 320 may include at least one insulating material. For example, the encapsulant 320 may include an epoxy-based resin, a thermosetting resin, a thermoplastic resin, and/or a material in which these resins are mixed with an inorganic filler. For example, the encapsulant 320 may include prepreg, Ajinomoto build up film (ABF), FR-4, bismaleimide triazine (BT), or the like. Alternatively, the encapsulant 320 may include an epoxy molding compound (EMC).

Referring to FIGS. 5 through 9, the first carrier substrate CA1 may be removed from the resultant structure of FIG. 7, and the resultant structure of FIG. 7 in which the first carrier substrate CA1 has been removed may be turned over and arranged on a second carrier substrate CA2. On the second carrier substrate CA2, the surface of the semiconductor chip 310 provided with the chip pad 311 may be exposed upward. Because descriptions of the second carrier substrate CA2 are substantially the same as those of the first carrier substrate CA1 described above, detailed descriptions thereof are omitted.

Next, the redistribution structure 330 may be formed on the encapsulant 320 and the plurality of semiconductor chips 310 (S130). Here, the redistribution structure 330 may include a redistribution pattern and a redistribution insulating layer 339.

The redistribution insulating layer 339 may cover one surface of the semiconductor chip 310 on which the chip pad 311 is formed, and one surface of the encapsulant 320 on the same or similar level to the one surface of the semiconductor chip 310. The redistribution insulating layer 339 may electrically insulate various components included in the redistribution structure 330. The redistribution insulating layer 339 may include an insulating material made of a photo imagable dielectric (PID) material capable of being processed by a photolithography process. For example, the redistribution insulating layer 339 may include photosensitive polyimide. Alternatively, the redistribution insulating layer 339 may include silicon oxide or silicon nitride.

A redistribution pattern may include a conductive line pattern 331 extending in the horizontal direction and a conductive via pattern 333 extending in the vertical direction. The conductive line pattern 331 may have a single layer or multilayer structure. The conductive via pattern 333 may electrically connect the conductive line pattern 331 to the chip pad 311 of the semiconductor chip 310, or electrically connect the conductive line patterns 331, apart from each other in the vertical direction, to each other.

The conductive line pattern 331 and the conductive via pattern 333 may include (e.g.,) at least one of tungsten (W), titanium (Ti), copper (Cu), nickel (Ni), aluminum (Al), palladium (Pd), and gold (Au).

In addition, the redistribution pattern may include an external pad 335 protruding (or exposed) from the redistribution insulating layer 339. The external pad 335 may be electrically/physically connected to the conductive line pattern 331 via the opening of the redistribution insulating layer 339. For example, the external pad 335 may be electrically connected to the chip pad 311 of one of the plurality of semiconductor chips 310 via the conductive line pattern 331 and the conductive via pattern 333. The external pad 335 may include (e.g.,) an under bump metallurgy (UBM) to which the external connector 350 is attached. Here, the external pad 335 may include at least one of W, Ti, Cu, Ni, Al, Pd and Au.

In certain embodiments, the plurality of semiconductor chips 310, the encapsulant 320, and the redistribution structure 330 may constitute the panel-shaped package structure 300.

With reference to FIGS. 6 through 9, a process of forming the package structure 300 using a chip-first method includes; after the semiconductor chip 310 is arranged on the first carrier substrate CA1, forming the encapsulant 320, and then forming the redistribution structure 330. However, the inventive concept is not limited thereto, and the package structure 300 may be manufactured (e.g.,) using a chip-last method including; after the redistribution structure 330 is formed, mounting the plurality of semiconductor chips 310 using (e.g.,) a flip-chip method, and then forming the encapsulant 320.

Referring to FIGS. 5, 8, 10, and 11, the second carrier substrate CA2 may be removed, and the frame jig 100 may be attached to the encapsulant 320. The frame jig 100 may be attached to one surface of the encapsulant 320 exposed by removing the second carrier substrate CA2 (S140). For example, a panel-shaped frame body 110 may be attached to the encapsulant 320 using the adhesive material layer 120. Because the frame jig 100 supports the package structure 300 separated from the second carrier substrate CA2, warpage of the package structure 300 may be suppressed.

The frame jig 100 may be attached to an edge region of a lower surface of the encapsulant 320. In this case, the frame jig 100 may be in the scribe lane SLA that will subsequently be removed during a sawing process.

Figure 12:
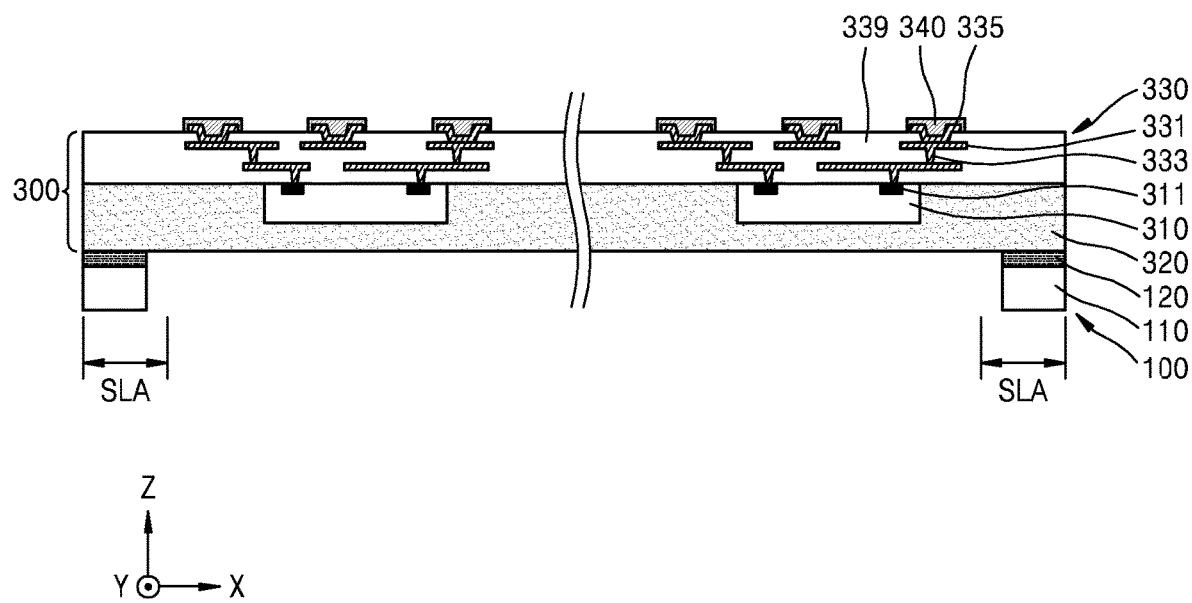

Referring to FIGS. 5 and 12, after attaching the frame jig 100 to the encapsulant 320, flux 340 may be formed on the external pad 335 of the redistribution structure 330 (S150).

The flux 340 may cover the external pad 335. The flux 340 may prevent an oxide layer from being formed on the exposed surface(s) of the conductive material constituting the external connector (see, e.g., FIG. 13) or the surface of the external pad 335 during the reflow process. The flux 340 may also improve wettability of the conductive material with respect to the external pad 335.

Figure 13:
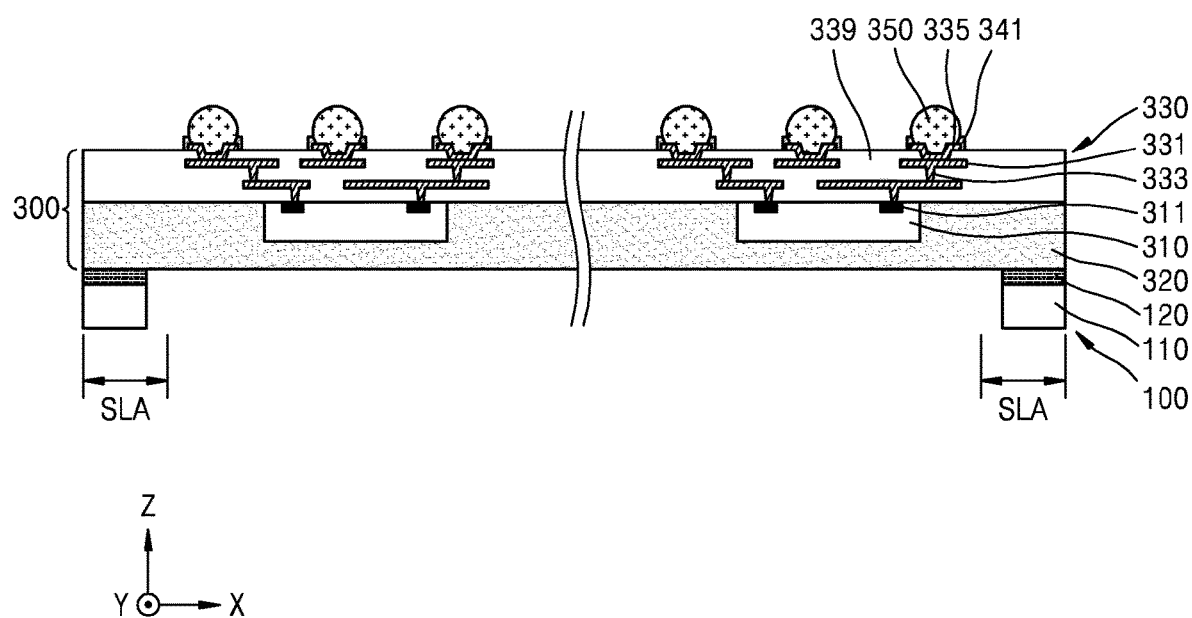

Referring to FIGS. 5 and 13, a solder ball may be arranged on the external pad 335 of the redistribution structure 330, and the external connector 350 may be formed on the external pad 335 by performing the reflow process (S160).

The external connector 350 may be formed using a process in which the solder ball on the external pad 335 is melted at a high temperature during the reflow process and then cured. Because the reflow process is performed in a state where deformation of the package structure 300 is prevented or suppressed by the frame jig 100, a non-wet defect in which the external connector 350 is not connected to the external pad 335 may be prevented.

Figure 14:
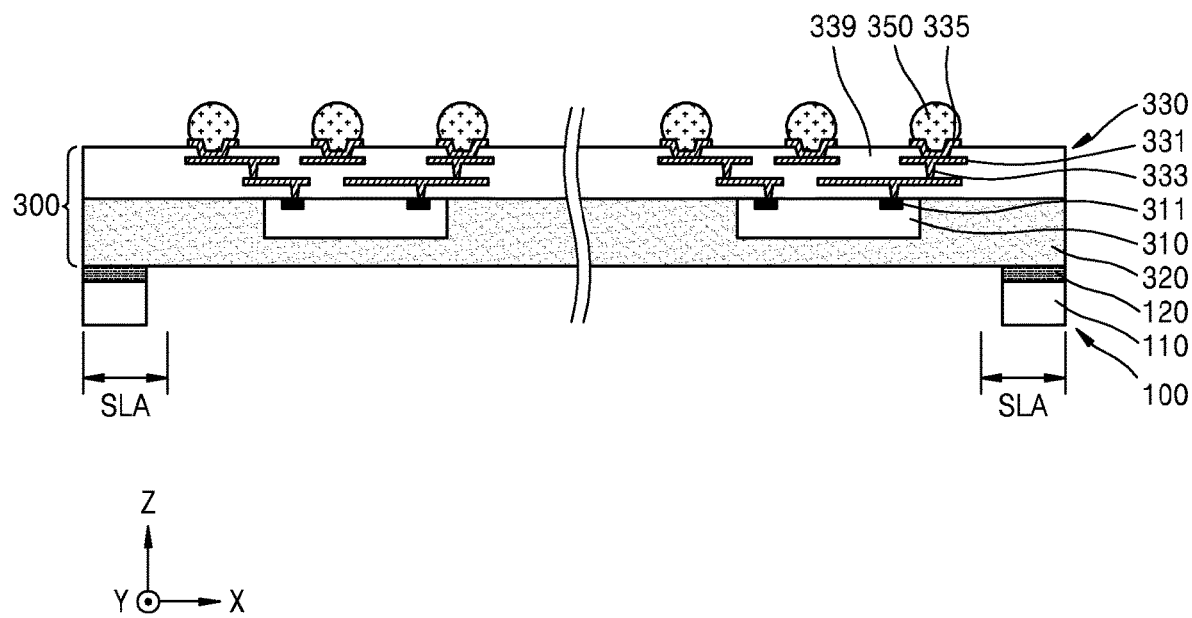

Referring to FIGS. 5, 13, and 14, after the reflow process is performed, flux residue 341 may be removed (S170).

The flux residue 341 may be removed by a wet flux cleaning process using a cleaning agent. The cleaning agent may include, for example, a hydrophilic solvent, a surfactant, and an alcohol-based solution.

As a comparative example, as the wet flux cleaning process for removing the flux residue 341 is performed when the package structure 300 is supported by a carrier of a plate shape, the cleaning agent may penetrate into a gap between the carrier and the package structure 300. The cleaning agent having penetrated into the gap between the carrier and the package structure 300 may not be dried in a drying operation and remain on the package structure 300, and then the reliability of the semiconductor package may be reduced due to a cleaning agent residue.

However, according to certain embodiments of the inventive concept, the frame jig 100 may be attached only in the scribe lane SLA of the package structure 300, which will be removed by a subsequent sawing process, and thus, the cleaning agent may not remain in a region where the plurality of semiconductor chips 310 are arranged. In addition, the cleaning agent remaining between the frame jig 100 and the package structure 300 may be removed together with a portion of the package structure 300 in a region of the scribe lane SLA during the sawing process. Thus, according to embodiments of the inventive concept, reduction in the reliability of the semiconductor package due to detergent residue may be prevented.

Figure 15:
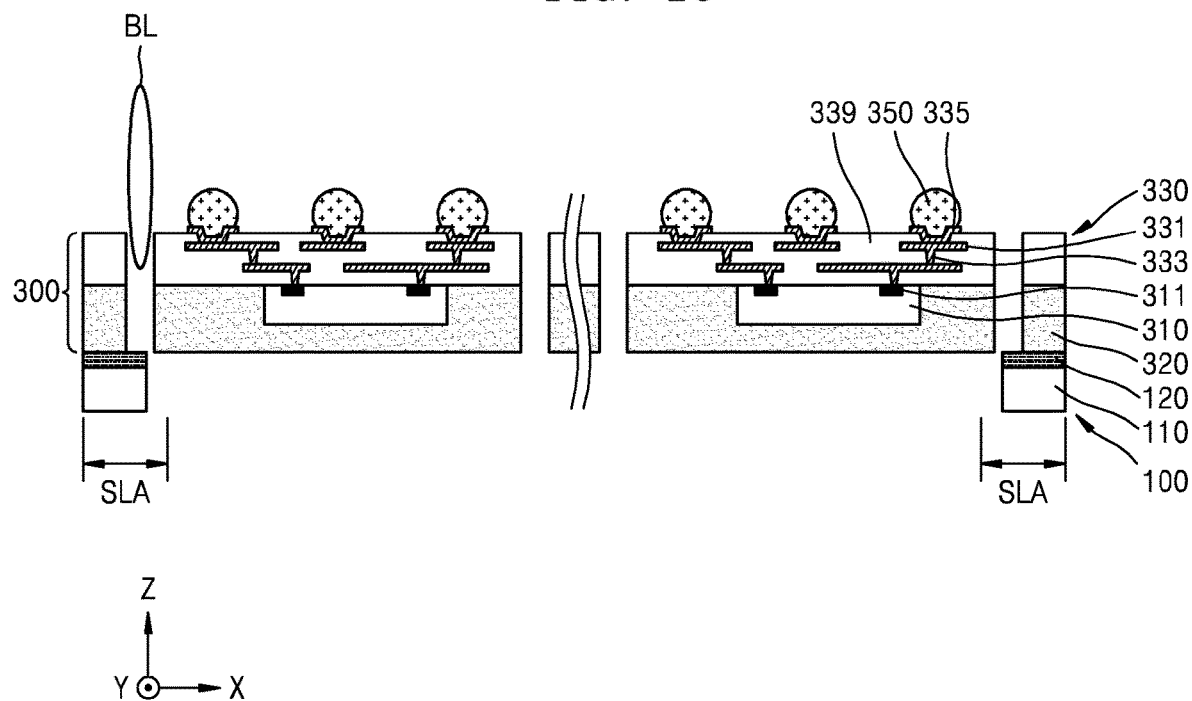

Referring to FIGS. 5 and 15, a sawing process for cutting the resultant structure of FIG. 14 along the scribe lane SLA of the package structure 300 and using a sawing blade BL may be performed (S180). With the sawing process, the package structure 300 of a panel shape may be separated into individualized semiconductor packages.

For example, the sawing blade BL may cut the package structure 300 along the cutting line SAL as illustrated in FIG. 11. When a portion of the package structure 300 in the scribe lane SLA is removed by using the sawing blade BL, the frame jig 100 attached to the inside of the scribe lane SLA may also be removed.

As a comparative example, when the package structure 300 is supported on a carrier of a plate shape, the carrier may need to be separated from the package structure 300 before the sawing process is performed. In this case, because warpage may occur in the package structure 300 after the carrier is separated from the package structure 300, it may be difficult to precisely perform the sawing process. However, according to embodiments of the inventive concept, because the frame jig 100 supports the package structure 300 even while the sawing process is in progress, the sawing process may be stably performed.

In methods of manufacturing the semiconductor package according to embodiments of the inventive concept, because the frame jig 100 suppresses warpage of the panel-shaped package structure 300 to a low level, certain issues that may arise in relation to the warpage (e.g., non-wet defects or the like) may be prevented. Accordingly, resulting semiconductor packages having improved reliability may be manufactured.

Figure 16:
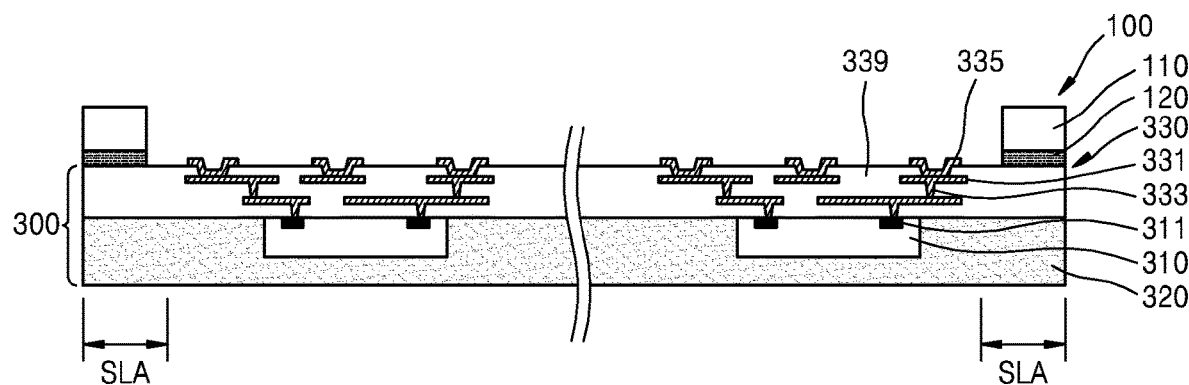
FIGS. 16, 17 and 18 are cross-sectional view illustrating a frame jig for manufacturing a semiconductor package attached to a panel-shaped package structure according to embodiments of the inventive concept.
Figure 16:
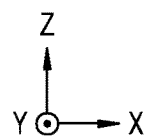
Figure 17:
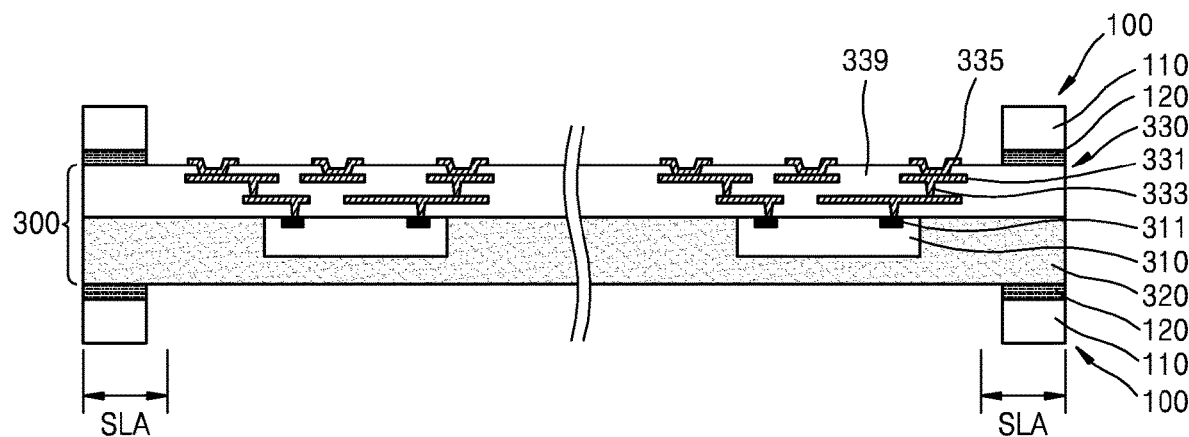
Figure 17:
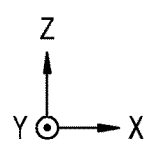

FIGS. 16 and 17 are respective cross-sectional views illustrating the frame jig 100 for manufacturing the semiconductor package attached to the panel-shaped package structure 300 according to embodiments of the inventive concept.

Figure 10:
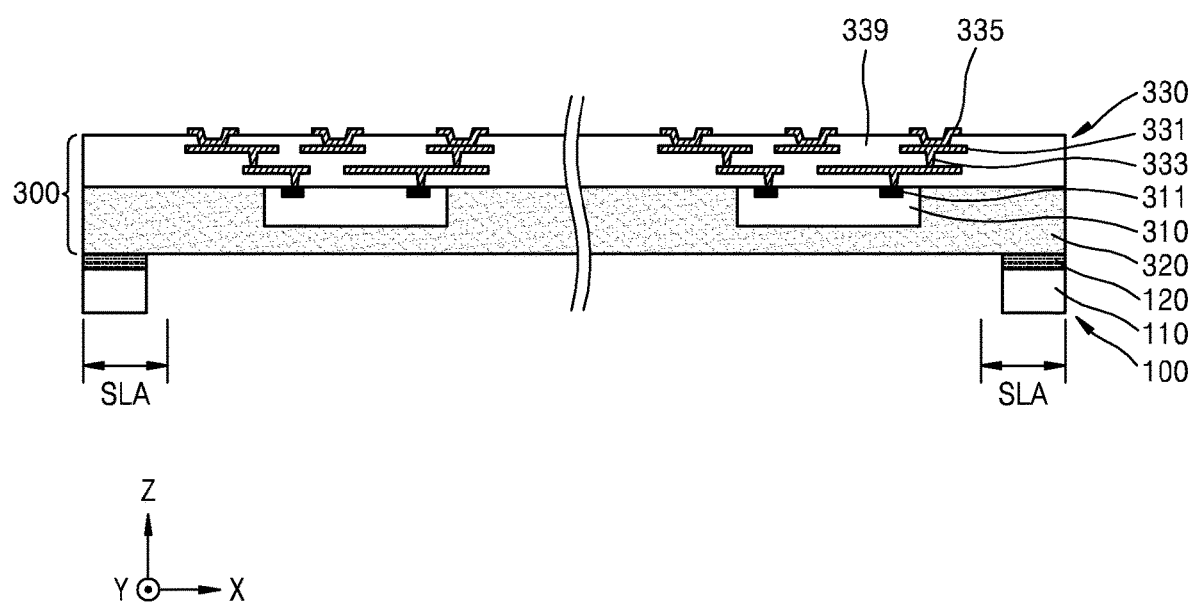
Figure 11:
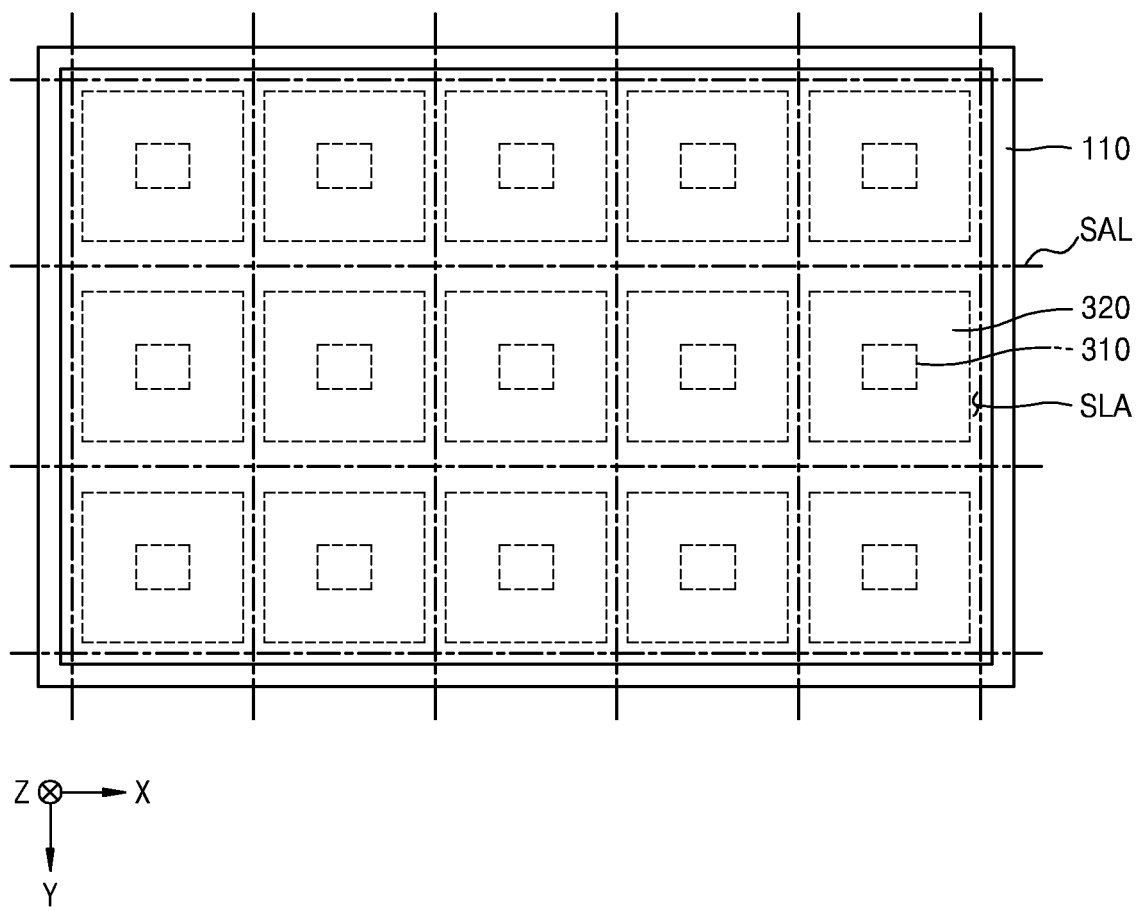

Referring to FIG. 16, as compared with the embodiments described in relation to FIGS. 10 and 11, the frame jig 100 may be attached to the redistribution structure 330. The frame jig 100 may be attached to the edge region of the top (or upper) surface of the redistribution insulating layer 339, and may be arranged in the scribe lane SLA. For example, the frame body 110 may be attached to the redistribution insulating layer 330 by using the adhesive material layer 120, and the second carrier substrate (CA2 in FIG. 8) may be removed. Because the frame jig 100 supports the package structure 300 separated from the second carrier substrate CA2, warpage of the package structure 300 may be suppressed.

Referring to FIG. 17, as compared with the embodiments described in relation to FIGS. 10 and 11, two (2) frame jigs 100 may be respectively attached to the lower and upper sides of the package structure 300. One frame jig 100 may be attached to the edge region of the main surface of the encapsulant 320, and another frame jig 100 may be attached to the edge region of the top surface of the redistribution insulating layer 339. Both of the frame jigs 100 may be in the scribe lane SLA. Because the two frame jigs 100 support the package structure 300 separated from the second carrier substrate (CA2 in FIG. 8), warpage of the package structure 300 may be further suppressed.

Figure 18:
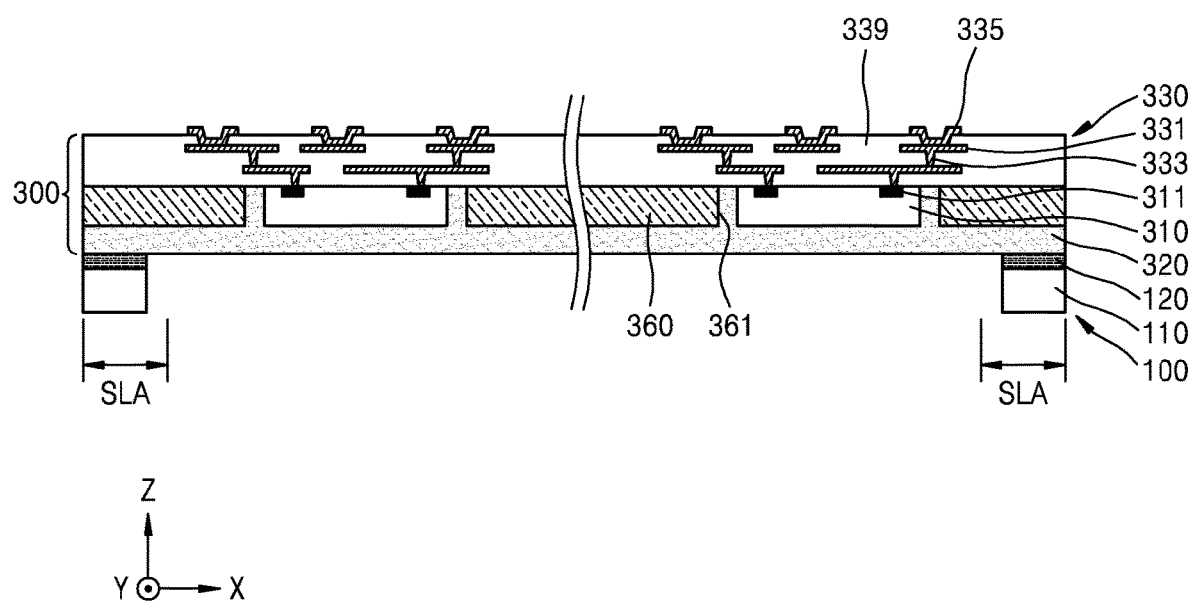

FIG. 18 is a cross-sectional view illustrating the frame jig 100 for manufacturing the semiconductor package attached to the panel-shaped package structure 300 according to embodiments of the inventive concept.

Referring to FIG. 18, the package structure 300 may further include a support substrate 360, where the support substrate 360 may include a plurality of cavities 361 in which the plurality of semiconductor chips 310 are respectively accommodated. Each of the plurality of cavities 361 may be a through hole penetrating the support substrate 360. The encapsulant 320 may be filled in the cavities 361 of the support substrate 360 to cover at least a portion of the plurality of semiconductor chips 310, and may cover the support substrate 360. The encapsulant 320 may mold the support substrate 360 and the plurality of semiconductor chips 310.

When the package structure 300 includes the support substrate 360, to form the package structure 300, an operation of placing the plurality of semiconductor chips 310 in the cavities 361 of the support substrate 360, an operation of forming the encapsulant 320 filling the cavities 361 of the support substrate 360 to seal the semiconductor chip 310, and an operation of forming the redistribution structure 330 may be performed.

For example, the support substrate 360 may include a substrate used for manufacturing a panel-level package. In example embodiments, the support substrate 360 may include a printed circuit board panel. In addition, the support substrate 360 may improve the rigidity of the package structure 300. For example, the support substrate 360 may include silicon, ceramic, plastic, polymer, or the like. Alternatively, for example, the support substrate 360 may include a metal material such as stainless steel, W, and Ti.

While the inventive concept has been particularly shown and described with reference to embodiments thereof, it will be understood that various changes in form and details may be made therein without departing from the spirit and scope of the following claims.

What is claimed is:

1. A frame jig for manufacturing a semiconductor package having separable individual semiconductor packages, the frame jig comprising:
    a frame body having a rectangular shape attached to a panel-shaped package structure of the semiconductor package having the separable individual semiconductor packages, wherein the frame body comprises polyphenylene sulfide;
    an adhesive material layer arranged on a lower surface of the frame body to adhere the frame body to the package structure; and
    at least one identification mark disposed on an upper surface of the frame body.

2. The frame jig of claim 1, wherein the frame body is attached within an edge region of a main surface of the package structure and includes an opening exposing a region inside the edge region of the main surface of the package structure.

3. The frame jig of claim 1, wherein a height of the frame body in contact with the package structure ranges between about 1.4 mm to about 60 mm.

4. The frame jig of claim 1, wherein a flexural modulus of the frame body ranges between about 15 GPa and about 25 GPa.

5. The frame jig of claim 1, wherein the frame body comprises:
    a composite material including glass fiber mixed with polyphenylene sulfide.

6. The frame jig of claim 1, wherein the frame body comprises:
    a composite material including carbon fiber mixed with polyphenylene sulfide.

7. A semiconductor package manufacturing apparatus, comprising:
    a stage that supports a panel-shaped package structure of the semiconductor package, the package structure including a plurality of semiconductor chips and an encapsulant surrounding side surfaces of the plurality of semiconductor chips; and
    a frame jig between the stage and the package structure, the frame jig including a frame body having a ring shape attached to an edge portion of a main surface of the encapsulant, wherein the frame body continuously extends along edges of the main surface of the encapsulant.

8. The apparatus of claim 7, wherein the frame body comprises at least one of plastic, ceramic and metal.

9. The apparatus of claim 7, wherein the frame body comprises a composite material including at least one of glass fiber and carbon fiber is mixed with polyphenylene sulfide.

10. The apparatus of claim 7, wherein a flexural modulus of the frame body ranges between about 15 GPa and about 25 GPa.

11. The apparatus of claim 7, wherein height of the frame body ranges between about 1.4 mm to about 60 mm, and is uniform around the frame body.

12. The apparatus of claim 7, wherein the frame body has a rectangular shape including four sides, includes a lower surface in contact with the package structure and an opposing second surface, and further includes four identification marks respectively provided on the second surface of each one of the four sides.

13. The apparatus of claim 7, further comprising:
    a reflow device including a heat source that heats an external connector on the package structure.

14. A method of manufacturing a semiconductor package, the method comprising:
    forming a panel-shaped package structure including a plurality of semiconductor chips and an encapsulant surrounding side surfaces of the plurality of semiconductor chips;
    attaching a ring-shaped frame jig to an edge portion of the main surface of the encapsulant;
    performing a reflow process to form an external connector on the package structure; and
    cutting the package structure along a scribe lane of the package structure.

15. The method of claim 14, further comprising:
    forming a redistribution structure on each one of the plurality of semiconductor chips.

16. The method of claim 15, wherein the encapsulant is in direct contact with the frame jig and the redistribution structure.

17. The method of claim 15, further comprising: attaching an additional frame jig to a redistribution insulating layer of the redistribution structure.

* * * * *